(12) United States Patent
Kobayashi

(10) Patent No.: US 11,791,408 B2
(45) Date of Patent: *Oct. 17, 2023

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Kenya Kobayashi, Nonoichi Ishikawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/744,308

(22) Filed: May 13, 2022

(65) Prior Publication Data
US 2022/0278232 A1   Sep. 1, 2022

Related U.S. Application Data

(63) Continuation of application No. 17/181,247, filed on Feb. 22, 2021, now Pat. No. 11,362,210.

(30) Foreign Application Priority Data

Jul. 30, 2020   (JP) ................................ 2020-129272

(51) Int. Cl.
*H01L 29/78* (2006.01)
*H01L 29/45* (2006.01)

(52) U.S. Cl.
CPC .......... *H01L 29/7827* (2013.01); *H01L 29/45* (2013.01)

(58) Field of Classification Search
CPC ........................... H01L 29/7827; H01L 29/45
(Continued)

(56) References Cited

U.S. PATENT DOCUMENTS

| 5,637,898 A | 6/1997 | Baliga |
| 5,998,833 A | 12/1999 | Baliga |

(Continued)

FOREIGN PATENT DOCUMENTS

| JP | 2016-072482 A | 5/2016 |
| JP | 2017-055016 A | 3/2017 |

(Continued)

OTHER PUBLICATIONS

Wang, Qi, et al., "Power Trench MOSFET Devices on Metal Substrated," IEEE Electron Device Letters, vol. 29, No. 9, Sep. 2008, pp. 1040-1042.

(Continued)

*Primary Examiner* — Monica D Harrison
(74) *Attorney, Agent, or Firm* — Allen & Overy LLP

(57) ABSTRACT

According to one embodiment, a semiconductor device includes first and second electrodes, first, second, and third semiconductor regions, an insulating part, a conductive part, and a gate electrode. The first semiconductor region is provided on the first electrode and is electrically connected to the first electrode. The second semiconductor region is provided on the first semiconductor region. The third semiconductor region is provided on the second semiconductor region. The insulating part is provided on the first electrode.

(Continued)

The conductive part is provided in the insulating part and is arranged with the first semiconductor region. The gate electrode is provided in the insulating part. The gate electrode is positioned above the conductive part and is arranged with the second semiconductor region. The second electrode is provided on the third semiconductor region and the insulating part, and is electrically connected to the third semiconductor region.

9 Claims, 14 Drawing Sheets

(58) Field of Classification Search
USPC .......................................................... 257/329
See application file for complete search history.

(56) References Cited

U.S. PATENT DOCUMENTS

| | | | |
|---|---|---|---|
| 9,525,059 | B1 | 12/2016 | Kobayashi |
| 9,536,959 | B2 | 1/2017 | Kobayashi |
| 9,716,009 | B2 | 7/2017 | Kobayashi et al. |
| 9,954,055 | B2 | 4/2018 | Kobayashi et al. |
| 10,453,930 | B2 | 10/2019 | Nishiguchi |
| 11,362,210 | B2 * | 6/2022 | Kobayashi ........ H01L 29/41741 |
| 2019/0081173 | A1 | 3/2019 | Nishiwaki et al. |

FOREIGN PATENT DOCUMENTS

| | | |
|---|---|---|
| JP | 2018-182258 A | 11/2018 |
| JP | 2019-054071 A | 4/2019 |
| JP | 2019-054273 A | 4/2019 |

OTHER PUBLICATIONS

H-R Chang et al., "Ultra Low Specific On-Resistance UMOS FET," IEEE Transactions on ED, 1986, pp. 642-645.

Kobayashi et al., "Sub-micron Cell Pitch 30 V N-channel UMOSFET with Ultra Low On-resistance," Proceedings of the 19th International Symposium on Power Semiconductor Devices & ICs, May 27-30, 2007, pp. 205-208.

Baba et al., "A Study on a High Blocking Voltage UMOS-FET With a Double Gate Structure," Proceedings of 1992 International Symposium on POwer Semiconductor Devices & ICs, Tokyo, pp. 300-302.

Wang et al., "High-Performance Gate-Enhanced Power UMOSFET With Optimized Structure," IEEE Electron Device Letters, vol. 31, No. 11, Nov. 2010, pp. 1281-1283.

KobayashiK, et al., "100-V Class Two-step-oxide Field-Plate Trench MOSFET to Achieve Optimum RESURF Effect and Ultralow On-resistance," Advanced Discrete Development Center, Toshiba Electronic Devices & Storage Corporation, Ishikawa, JP, IEEE, ISPSD, 2019, pp. 1-4.

Yu et al., Design of Gradient Oxide-Bypassed Superjunction Power MOSFET Devices, IEEE Transactions on Power Electronics, vol. 22, No. 4, Jul. 2007, pp. 1303-1310.

* cited by examiner

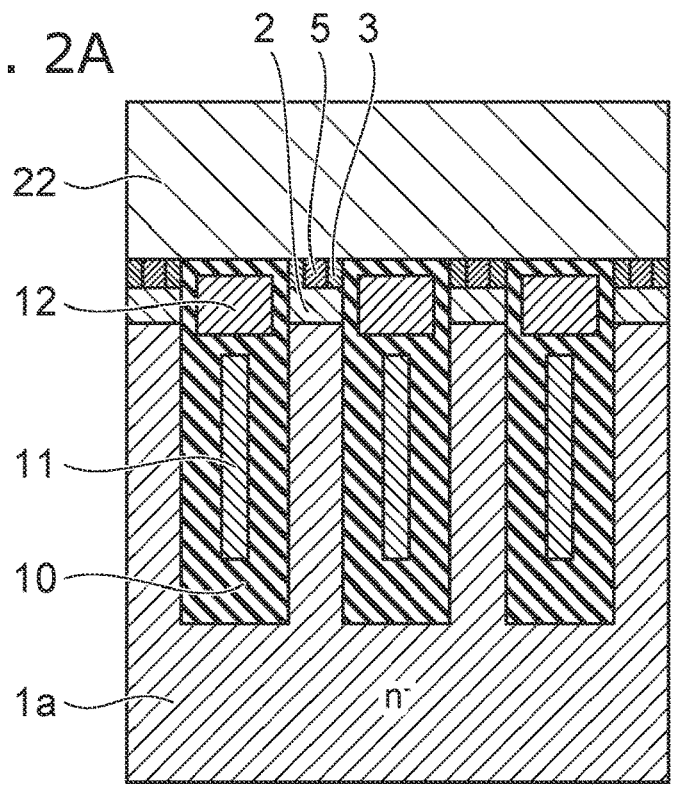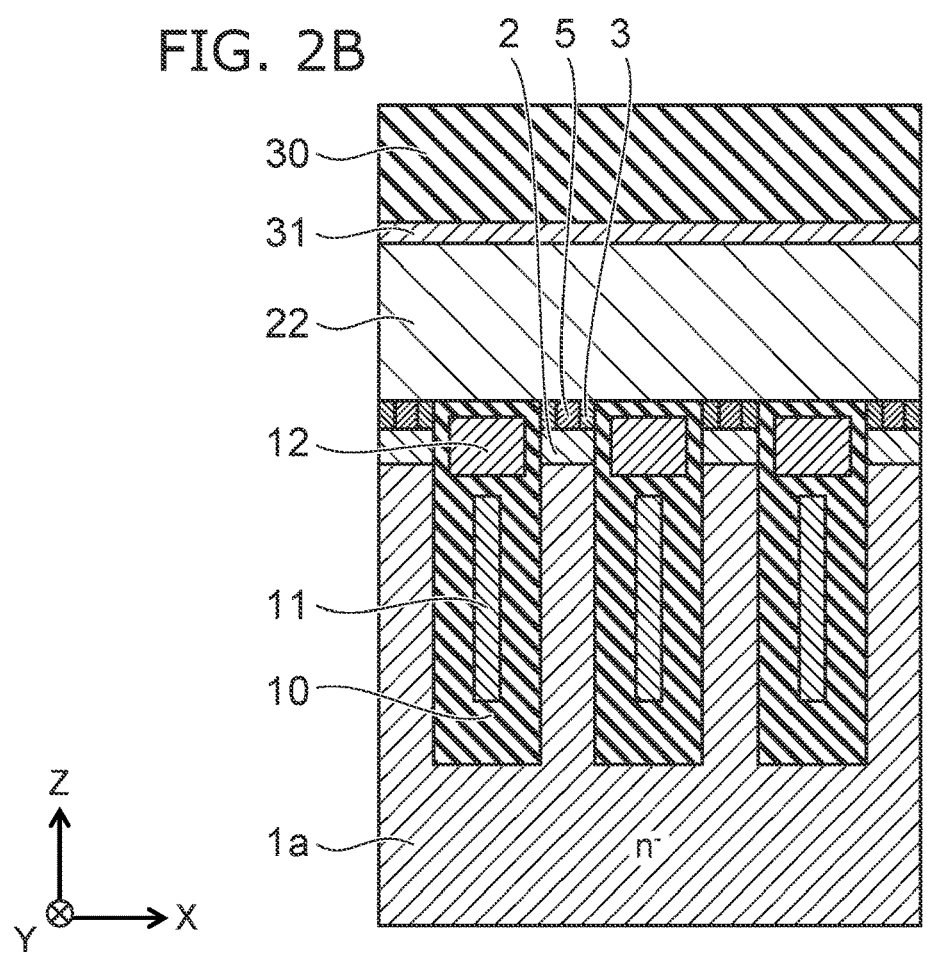

SEMICONDUCTOR DEVICE

CROSS-REFERENCE TO RELATED APPLICATIONS

This application is a continuation of U.S. application Ser. No. 17/181,247 filed on Feb. 22, 2021 and is based upon and claims the benefit of priority from Japanese Patent Application No. 2020-129272, filed on Jul. 30, 2020; the entire contents of which are incorporated herein by reference.

FIELD

Embodiments described herein relate generally to a semiconductor device.

BACKGROUND

Reduction in the on-resistance of semiconductor devices such as a metal-oxide-semiconductor field effect transistor (MOSFET) has been desired.

BRIEF DESCRIPTION OF THE DRAWINGS

FIGS. 2A and 2B are cross-sectional views illustrating a production process of the semiconductor device according to the embodiment;

DETAILED DESCRIPTION

Figure 1:
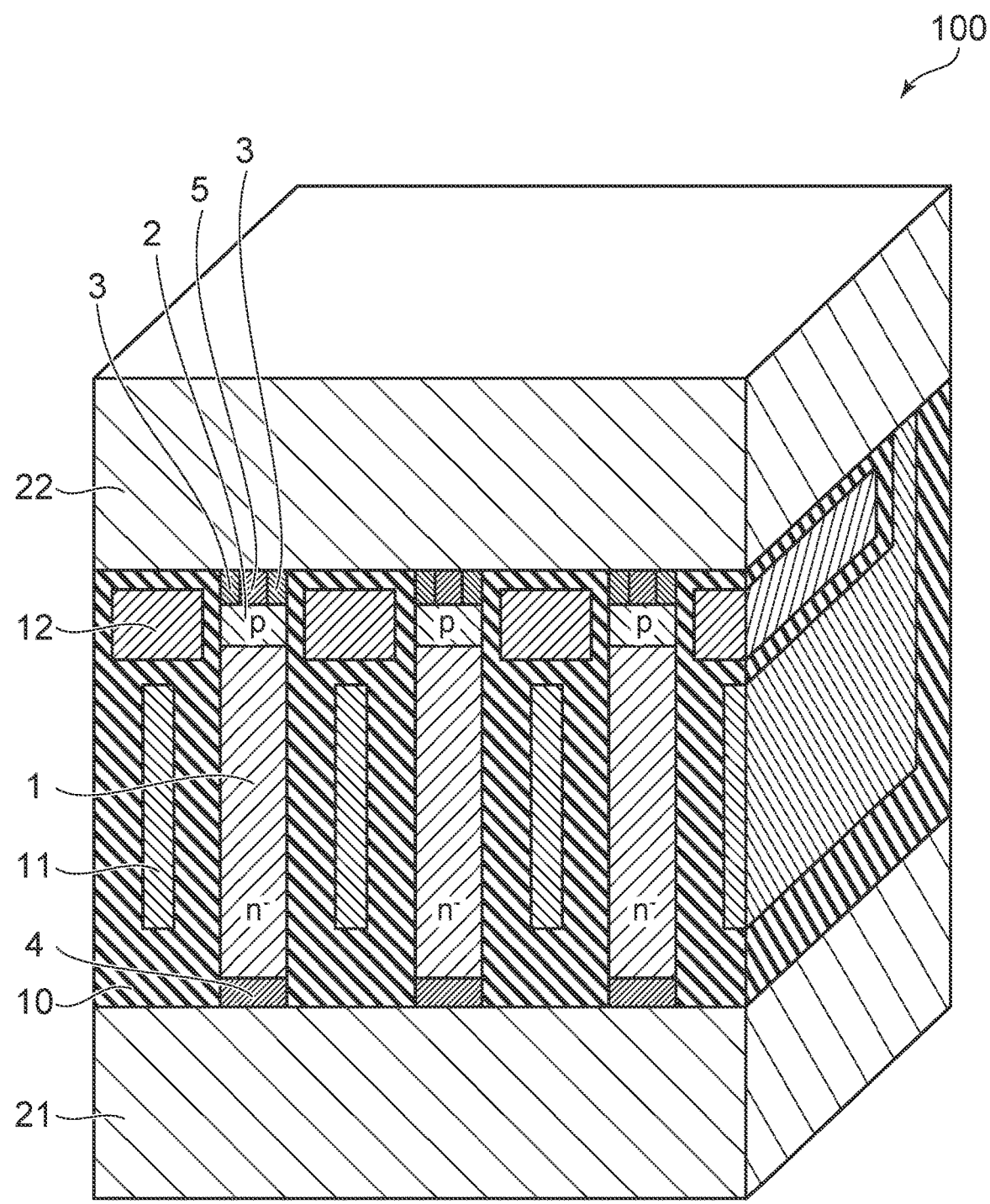
FIG. 1 is a perspective cross-sectional view illustrating a semiconductor device according to an embodiment.

According to one embodiment, a semiconductor device includes a first electrode, a first semiconductor region of a first conductivity type, a second semiconductor region of a second conductive type, a third semiconductor region of the first conductive type, an insulating part, a conductive part, a gate electrode, and a second electrode. The first semiconductor region is provided on the first electrode and is electrically connected to the first electrode. The second semiconductor region is provided on the first semiconductor region. The third semiconductor region is provided on the second semiconductor region. The insulating part is provided on the first electrode and is in direct contact with the first electrode. The conductive part is provided in the insulating part and is arranged in a second direction that crosses a first direction directed from the first electrode to the first semiconductor region, with the first semiconductor region. The gate electrode is provided in the insulating part. The gate electrode is positioned above the conductive part and is arranged in the second direction with the second semiconductor region. The second electrode is provided on the third semiconductor region and the insulating part, and is electrically connected to the third semiconductor region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the following description and drawings, the notations $n^+$, $n-$ and $p^+$, $p$ represent the relative highs and lows of each impurity concentration. That is, the notation with "+" indicates that the impurity concentration is relatively higher than the notation without either "+" or "−", and the notation with "−" indicates that the impurity concentration is relatively lower than the notation not marked with either "+" or "−". When a region contains both p-type impurities and n-type impurities, these notations represent the relative high and low of the net impurity concentration after the impurities have compensated for each other.

FIG. 1 is a perspective cross-sectional view illustrating a semiconductor device according to an embodiment.

A semiconductor device 100 according to an embodiment is a MOSFET. As illustrated in FIG. 1, the semiconductor device 100 according to an embodiment includes an $n^-$-type (first conductivity type) drift region 1 (first semiconductor region), a p-type (second conductivity type) base region 2 (second semiconductor region), an $n^+$-type source region 3 (third semiconductor region), an $n^+$-type drain region 4 (fourth semiconductor region), a $p^+$-type contact region 5, an insulating part 10, a conductive part 11, a gate electrode 12, a drain electrode 21 (first electrode), and a source electrode 22 (second electrode).

An XYZ orthogonal coordinate system is employed in the description of the embodiment. A direction directed from the drain electrode 21 to the $n^-$-type drift region 1 is Z-direction (first direction). Two directions that are perpendicular to Z-direction and orthogonal to each other are X-direction (second direction) and Y-direction (third direction). Further, for description, a direction directed from the drain electrode 21 to the $n^-$-type drift region 1 is referred to as "upper" and an opposite direction thereof is referred to as "lower". These directions are based on the relative positional relationship between the drain electrode 21 and the $n^-$-type drift region 1, and thus have no relationship with the direction of gravity.

The drain electrode 21 is provided on the lower surface of the semiconductor device 100. The $n^+$-type drain region 4 is provided on the drain electrode 21 and is electrically connected to the drain electrode 21. The $n^-$-type drift region 1 is provided on the n⁺-type drain region 4. The n⁻-type drift region 1 is electrically connected to the drain electrode 21 via the n⁺-type drain region 4. The n-type impurity density in the n⁻-type drift region 1 is lower than the n-type impurity density in the n⁺-type drain region 4.

The p-type base region 2 is provided on the n⁻-type drift region 1. The n⁺-type source region 3 and the p⁺-type contact region 5 are provided on the p-type base region 2. The p-type impurity density in the p⁺-type contact region 5 is higher than the p-type impurity density in the p-type base region 2.

The insulating part 10 is provided on the drain electrode 21 and is in direct contact with the drain electrode 21. The insulating part 10 is arranged in X-direction with the n⁻-type drift region 1, the p-type base region 2, the n⁺-type source region 3, the n⁺-type drain region 4, and the p⁺-type contact region 5. For example, the insulating part 10 is in direct contact with the n⁻-type drift region 1, the p-type base region 2, the n⁺-type source region 3, and the n⁺-type drain region 4.

The conductive part 11 and the gate electrode 12 are provided in the insulating part 10. The conductive part 11 is arranged in X-direction with the n⁻-type drift region 1. The gate electrode 12 is provided above the conductive part 11. The gate electrode 12 is arranged in X-direction with the p-type base region 2. A part of the insulating part 10 is provided as a gate insulating layer between the p-type base region 2 and the gate electrode 12. The source electrode 22 is provided on the n⁺-type source region 3, the p⁺-type contact region 5, and the insulating part 10, and is electrically connected to the n⁺-type source region 3 and the p⁺-type contact region 5.

For example, a plurality of n⁻-type drift regions 1, p-type base regions 2, n⁺-type source regions 3, n⁺-type drain regions 4, p⁺-type contact regions 5, insulating parts 10, conductive parts 11, and gate electrodes 12 are provided in X-direction. A pair of n⁺-type source regions 3 which are separated from each other in X-direction is provided on each p-type base region 2. The p⁺-type contact region 5 is positioned between the pair of n⁺-type source regions 3. The n⁻-type drift region 1, p-type base region 2, n⁺-type source region 3, n⁺-type drain region 4, p⁺-type contact region 5, insulating part 10, and conductive part 11, and gate electrode 12 each extend in Y-direction.

For example, the conductive part 11 is separated from the gate electrode 12 in Z-direction. The conductive part 11 is electrically separated from the gate electrode 12. The end portion of the conductive part 11 in Y-direction extends upward and is electrically connected to the source electrode 22. Alternatively, the conductive part 11 may extend in Z-direction to come into contact with the gate electrode 12 and is electrically connected to the gate electrode 12.

Operations of the semiconductor device 100 will be described.

A voltage higher than a threshold is applied to the gate electrode 12 in a state in which a voltage positive with respect to the source electrode 22 is applied to the drain electrode 21. A channel (inversion layer) is formed in the p-type base region 2. Electrons flow into the drain electrode 21 via the channel and the n⁻-type drift region 1. This brings the semiconductor device 100 into an on-state. Thereafter, when the voltage applied to the gate electrode 12 becomes lower than the threshold, the channel in the p-type base region 2 disappears, so that the semiconductor device 100 is brought into an off-state.

When the semiconductor device 100 is switched to the off-state, the positive voltage applied to the drain electrode 21 increases relative to the source electrode 22. A depletion layer extends from a p-n junction between the p-type base region 2 and the n⁻-type drift region 1 to the n⁻-type drift region 1. Further, a depletion layer formed due to the potential difference between the drain electrode 21 and the conductive part 11 extend from the interface between the insulating part 10 and the n⁻-type drift region 1 to the n⁻-type drift region 1. The breakdown voltage of the semiconductor device 100 can be increased by extension of the latter depletion layer. Alternatively, the n-type impurity density in the n⁻-type drift region 1 is increased while the breakdown voltage of the semiconductor device 100 is maintained, whereby the on-resistance of the semiconductor device 100 can be reduced.

An example of materials for constituent elements of the semiconductor device 100 will be described.

The n⁻-type drift region 1, the p-type base region 2, the n⁺-type source region 3, the n⁺-type drain region 4, and the p⁺-type contact region 5 include, as a semiconductor material, silicon, silicon carbide, gallium nitride, gallium oxide, or gallium arsenide. In a case where silicon is used as a semiconductor material, arsenic, phosphorus, or antimony can be used as the n-type impurity. Boron may be used as the p-type impurity. The conductive part 11 and the gate electrode 12 include a conductive material such as polysilicon. The insulating part 10 includes an insulating material such as silicon oxide. The drain electrode 21 and the source electrode 22 include a metal such as copper and aluminum.

FIGS. 2A and 2B, and FIGS. 3A and 3B are cross-sectional views illustrating a production process of the semiconductor device according to the embodiment.

An n⁻-type semiconductor substrate 1a is prepared. As illustrated in FIG. 2A, the insulating part 10, the conductive part 11, the gate electrode 12, the p-type base region 2, the n⁺-type source region 3, the p⁺-type contact region 5, and the source electrode 22 are formed in the semiconductor substrate 1a by a known method. For example, these elements are formed by formation of an opening in the upper surface of the semiconductor substrate 1a, embedding of the insulating material and conductive material into the opening, and implantation of ions into the upper surface of the semiconductor substrate 1a.

As illustrated in FIG. 2B, a support member 30 is bonded to the upper surface of the source electrode 22 with an adhesive 31. The support member 30 is, for example, a glass plate.

Figure 3A:
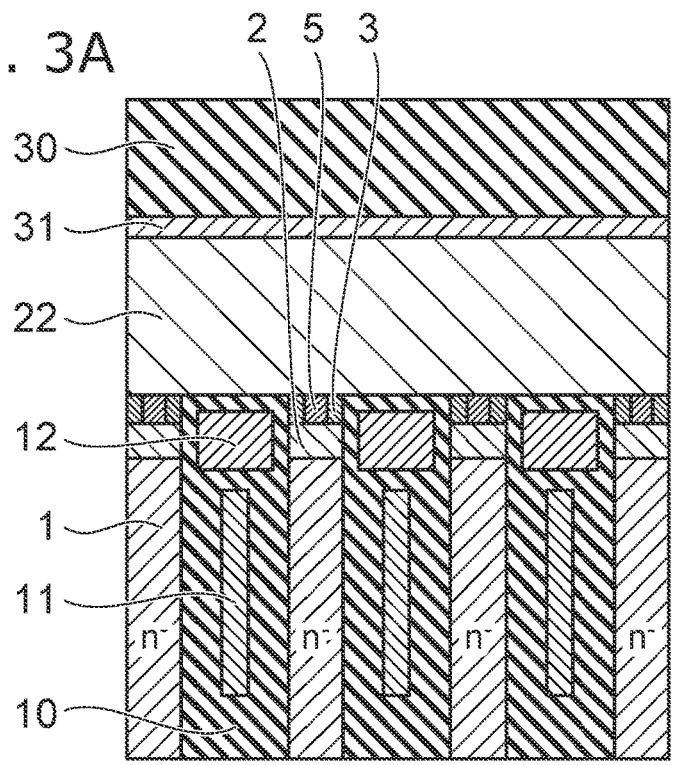
FIGS. 3A and 3B are cross-sectional views illustrating a production process of the semiconductor device according to the embodiment.

The lower surface of the semiconductor substrate 1a is ground. At that time, the semiconductor substrate 1a is ground so that the insulating part 10 is not exposed. As illustrated in FIG. 3A, the lower surface of the semiconductor substrate 1a is allowed to be recessed through chemical-mechanical polishing (CMP) or wet etching to expose the insulating part 10. The semiconductor substrate 1a remaining between the insulating parts 10 corresponds to the n⁻-type drift region 1.

Figure 3B:
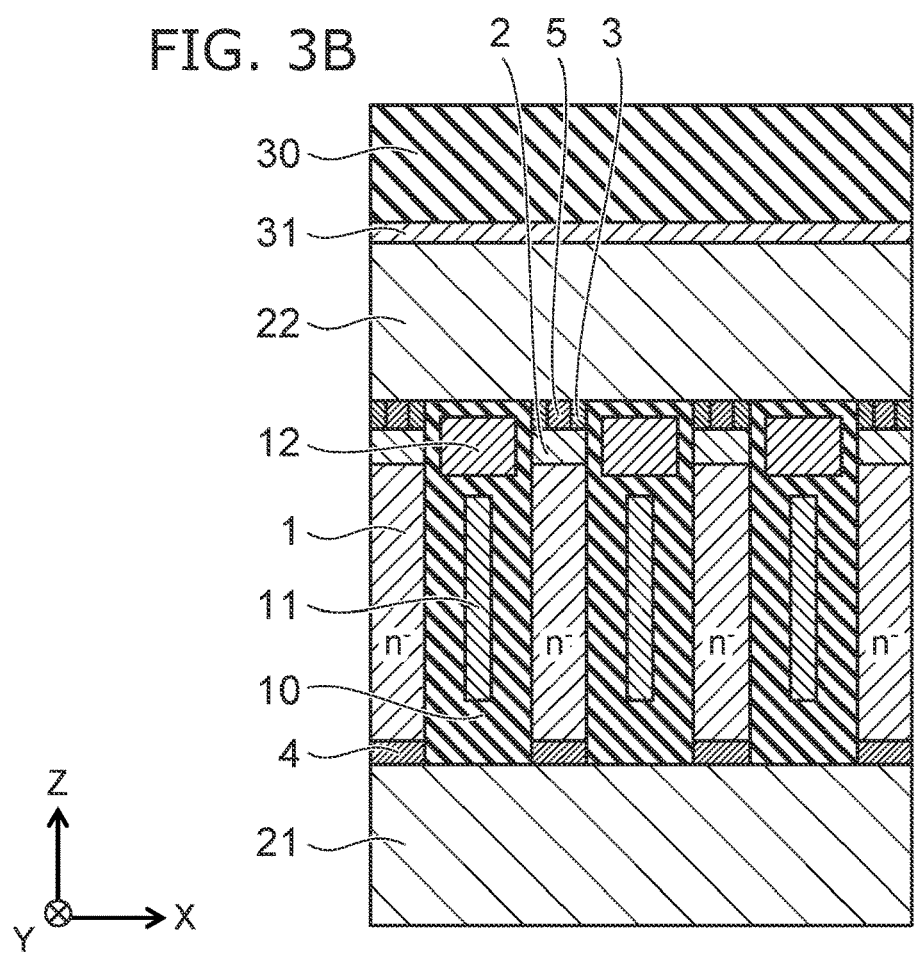

The n-type impurity is ion-implanted into the lower surface of the n⁻-type drift region 1 between the insulating parts 10 to form the n⁺-type drain region 4. As illustrated in FIG. 3B, the drain electrode 21 is formed under the n⁺-type drain region 4 and the insulating part 10 by sputtering. The support member 30 and the adhesive 31 are separated. Thus, the semiconductor device 100 according to an embodiment is produced.

Effects of the embodiment will be described.

In the semiconductor device 100, the drain electrode 21 is in direct contact with the insulating part 10. In other words, a semiconductor region is not provided between the drain electrode 21 and the insulating part 10. According to an embodiment, the distance between the drain electrode 21 and the p-type base region 2 can be shortened compared to a case where a semiconductor region is provided between the drain electrode 21 and the insulating part 10. When the semiconductor device 100 is in an on-state, the temperature of the p-type base region 2 where the channel is formed is more easily increased than the other portions. By shortening the distance between the drain electrode 21 and the p-type base region 2, heat generated in the p-type base region 2 is easily released from the drain electrode 21. Increase in the temperature in the semiconductor device 100 is suppressed. For example, increase in the electrical resistance of the n⁻-type drift region 1 due to temperature increase is suppressed, thus reducing the on-resistance of the semiconductor device 100.

Also, according to an embodiment, the path of the current flowing in Z-direction is shorter than a case where a semiconductor region is provided between the drain electrode 21 and the insulating part 10. Thereby, the on-resistance of the semiconductor device 100 can be further reduced.

In the formation of the insulating part 10, the conductive part 11, and the gate electrode 12, compressive stress is generated in these elements. Such compressive stress causes the semiconductor substrate 1a to be warped. In the semiconductor device 100, the drain electrode 21 and the source electrode 22 are respectively provided on the top and bottom of the insulating part 10. By providing electrodes on the top and bottom of the insulating part 10, the difference between the stress generated in the upper portion of the insulating part 10 and the stress generated in the lower portion of the insulating part 10 can be reduced compared to a case where a semiconductor region is provided between the drain electrode 21 and the insulating part 10. As a result, the warpage of the semiconductor device 100 can be reduced. For example, it is possible to reduce a possibility that the semiconductor device 100 is damaged due to warpage. When the semiconductor device 100 is conveyed by using the support member 30, the capacity to hold the support member 30 by the conveying device is improved, thus reducing a possibility of occurrence of falling or positional shift of the support member 30, and the like.

The semiconductor device 100 preferably includes the n⁺-type drain region 4. By providing the n⁺-type drain region 4, the electrical resistance between the drain electrode 21 and the n⁻-type drift region 1 can be reduced. For example, the on-resistance of the semiconductor device 100 can be reduced. Also, by providing the n⁺-type drain region 4 in X-direction at a position aligned with the lower end of the insulating part 10, the electric field intensity in the vicinity of the lower end of the n⁻-type drift region 1 is increased. Thereby, the breakdown voltage of the semiconductor device 100 can be improved.

As an example, in a case where a breakdown voltage of 100 V is obtained between the drain electrode 21 and the source electrode 22, the size and impurity density of each constituent element of the semiconductor device 100 is preferably the following values from the perspective of the on-resistance and the breakdown voltage. The length of the insulating part 10 in X-direction is longer than 1.0 μm and less than 1.5 μm. The length of the n⁻-type drift region 1 in X-direction is longer than 0.4 μm and less than 0.6 μm. The length of the n⁻-type drift region 1 in Z-direction is longer than 3.0 μm and less than 5.0 μm. The length of the p-type base region 2 in Z-direction is longer than 0.1 μm and less than 0.3 μm. The n-type impurity density in the n⁻-type drift region 1 is greater than $2.0 \times 10^{16}$ atoms/cm³ and less than $2.0 \times 10^{17}$ atoms/cm³. The p-type impurity density in the p-type base region 2 is greater than $3.0 \times 10^{17}$ atoms/cm³ and less than $1.0 \times 10^{18}$ atoms/cm³. The density of the n⁺-type source region 3, the n⁺-type drain region 4, and the p⁺-type contact region 5 is set such that these regions can be in ohmic contact with the drain electrode 21 and the source electrode 22.

(Modification)

FIGS. 4 to 8 are perspective cross-sectional views illustrating semiconductor devices according to modifications.

Figure 4:
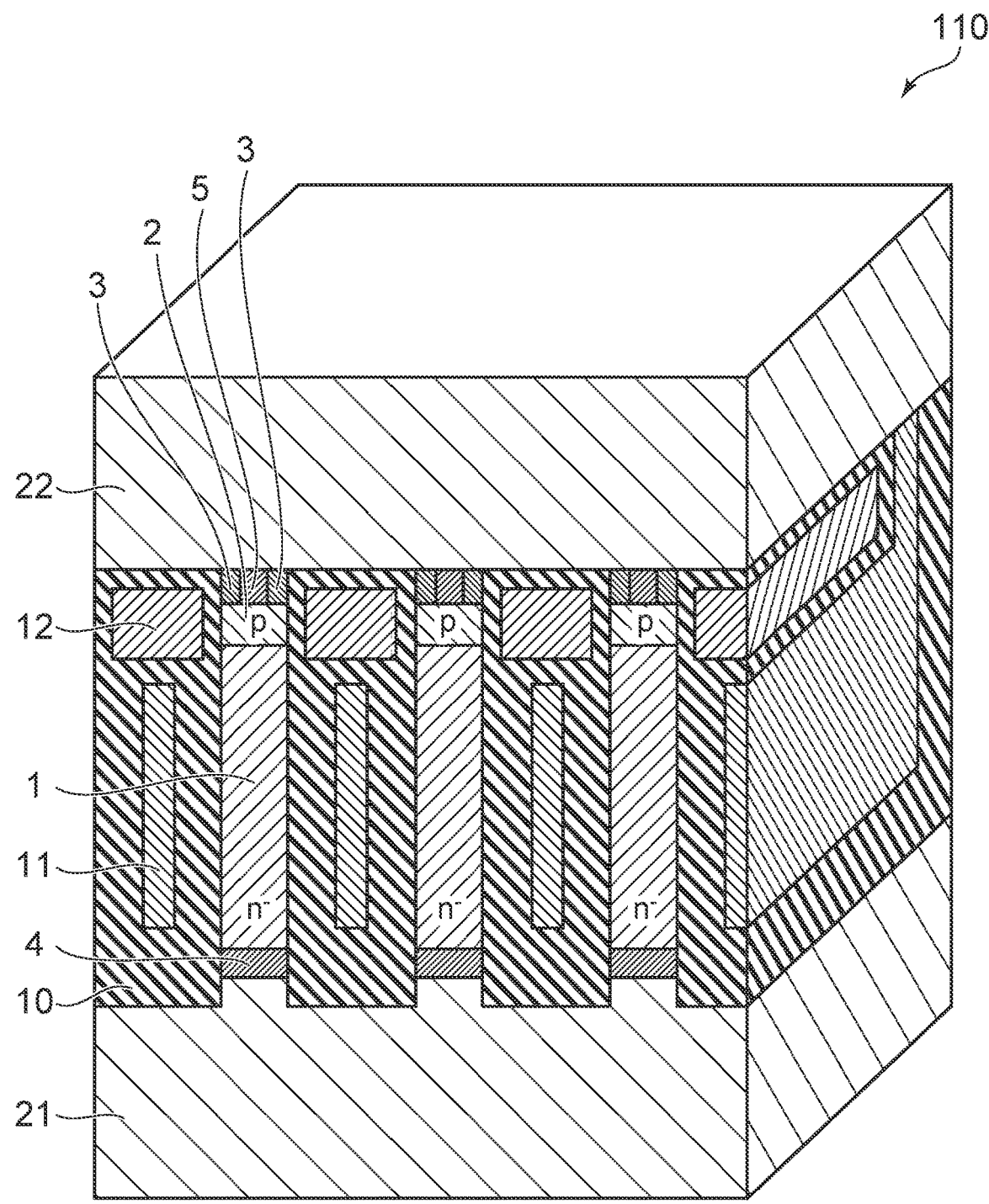
FIG. 4 is a perspective cross-sectional view illustrating a semiconductor device according to a modification.

As a semiconductor device 110 illustrated in FIG. 4, a part of the insulating part 10 may be arranged in X-direction with a part of the drain electrode 21. For example, the drain electrode 21 has protrusions provided between the lower ends of the insulating part 10 in X-direction. A plurality of protrusions and a plurality of lower ends of the insulating part 10 are alternately provided in X-direction.

The lower end of the insulating part 10 extends into the drain electrode 21 and arranged in X-direction with a part of the drain electrode 21. Thereby, the electric field intensity in the vicinity of the lower end of the n⁻-type drift region 1 is further increased. As a result, the breakdown voltage of the semiconductor device 110 can be improved.

Figure 5:
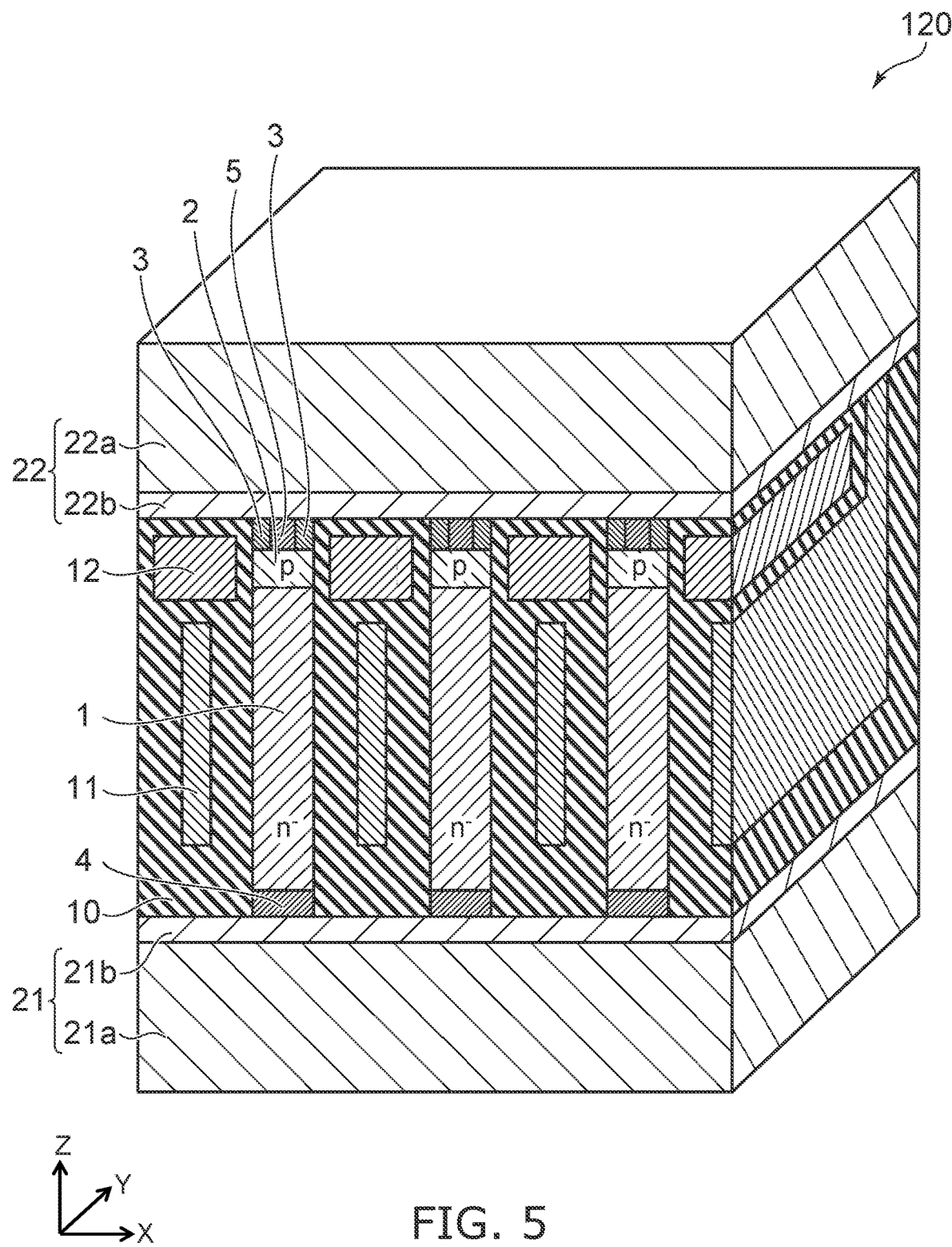
FIG. 5 is a perspective cross-sectional view illustrating a semiconductor device according to a modification.

As a semiconductor device 120 illustrated in FIG. 5, the drain electrode 21 may include a first metal layer 21a and a first conductive layer 21b. The first conductive layer 21b is provided between the first metal layer 21a and the n⁺-type drain region 4, and between the first metal layer 21a and the insulating part 10. For example, the first conductive layer 21b is in contact with the n⁺-type drain region 4 and the insulating part 10.

The first metal layer 21a includes a first metal. The first metal is at least one selected from the group consisting of aluminum, nickel, copper, silver, vanadium, and chromium. The first conductive layer 21b includes a second metal. The second metal is at least one selected from the group consisting of molybdenum, tungsten, cobalt, nickel, titanium, and aluminum. For example, the first metal is different from the second metal. The first metal and the second metal may be the same, and the composition of the first metal and the composition of the second metal may be different from each other. At least a part of the first conductive layer 21b may be silicide. Silicide includes silicon and the second metal. By providing the first conductive layer 21b, diffusion of the semiconductor material included in the n⁻-type drift region 1 and the n⁺-type drain region 4 can be suppressed.

The source electrode 22 may include a second metal layer 22a and a second conductive layer 22b. The second conductive layer 22b is provided between the insulating part 10 and the second metal layer 22a, between the n⁺-type source region 3 and the second metal layer 22a, and between the p⁺-type contact region 5 and the second metal layer 22a. The second metal layer 22a is provided on the second conductive layer 22b. For example, the second conductive layer 22b is in contact with the n⁺-type source region 3, the p⁺-type contact region 5, and the insulating part 10.

The second metal layer 22a includes a third metal. The third metal is at least one selected from the group consisting of aluminum, nickel, copper, silver, vanadium, and chromium. The second conductive layer 22b includes a fourth metal. The fourth metal is at least one selected from the group consisting of molybdenum, tungsten, cobalt, nickel, titanium, and aluminum. The third metal is different from the fourth metal. The third metal and the fourth metal may be the same, and the composition of the third metal and the composition of the fourth metal may be different from each other. At least a part of the second conductive layer 22b may be silicide. Silicide includes silicon and the fourth metal. By providing the second conductive layer 22b, diffusion of the semiconductor material included in the n⁺-type source region 3 and the p⁺-type contact region 5 can be suppressed.

Figure 6:
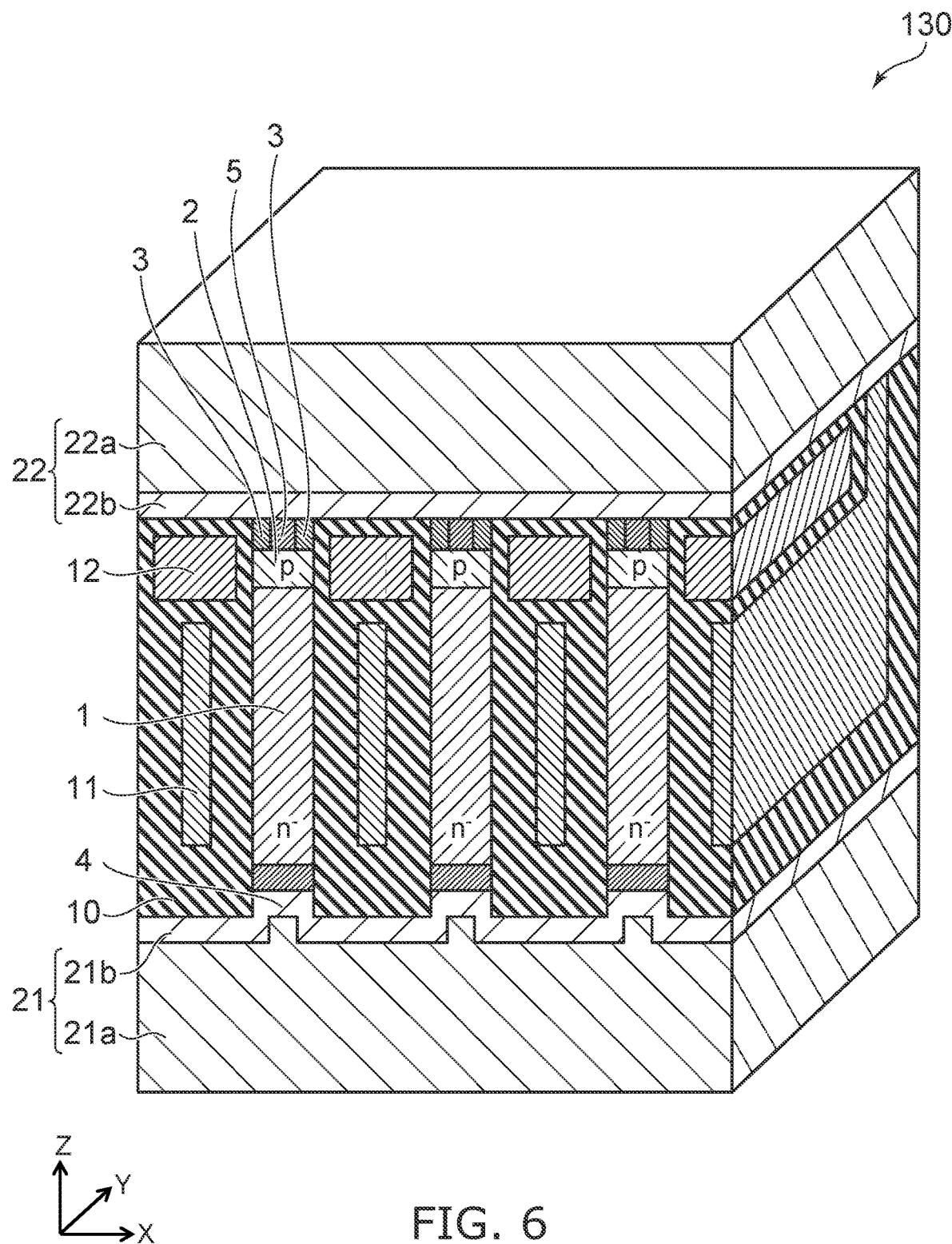
FIG. 6 is a perspective cross-sectional view illustrating a semiconductor device according to a modification.

As a semiconductor device 130 illustrated in FIG. 6, a part of the first conductive layer 21b may be arranged in X-direction with the insulating part 10. For example, the first conductive layer 21b has protrusions each provided between the lower ends of the insulating part 10 in X-direction. A plurality of protrusions and a plurality of lower ends of the insulating part 10 are alternately provided in X-direction.

According to the semiconductor device 130, the electric field intensity in the vicinity of the lower end of the n⁻-type drift region 1 is further increased as in the semiconductor device 110. As a result, the breakdown voltage of the semiconductor device 130 can be improved.

Figure 7:
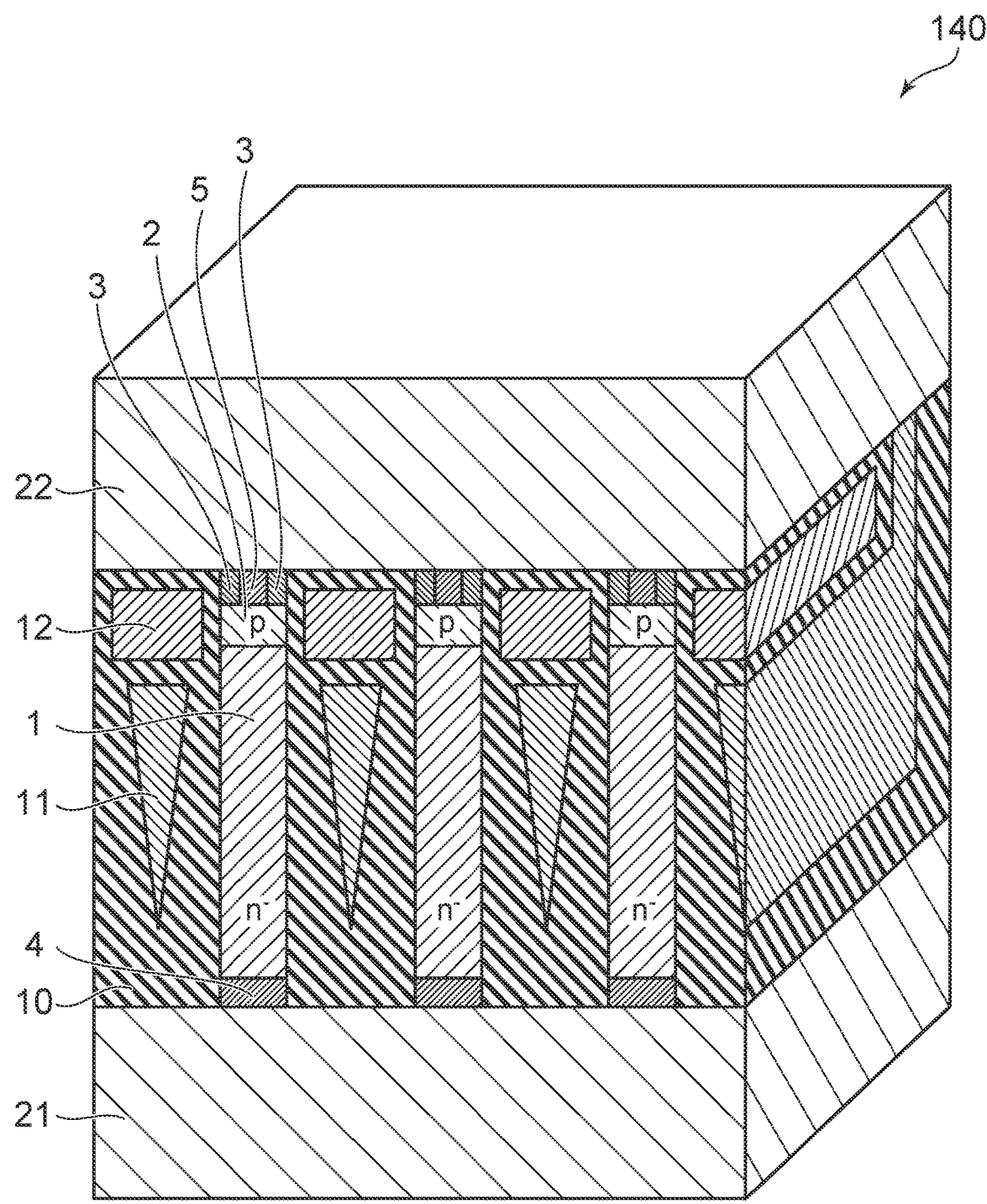
FIG. 7 is a perspective cross-sectional view illustrating a semiconductor device according to a modification.

As a semiconductor device 140 illustrated in FIG. 7, the width of the conductive part 11 (length in X-direction) may vary in Z-direction. The width of the lower portion of the conductive part 11 is narrower than the upper portion of the conductive part 11. The width of the conductive part 11 is decreased downwardly. For example, as illustrated in FIG. 7, the side surface of the conductive part 11 is inclined with respect to Z-direction, and the width of the conductive part 11 is gradually decreased downwardly. The conductive part 11 may have a stepped side surface, and the width of the conductive part 11 may be gradually decreased downwardly. The number of steps in the side surface of the conductive part 11 is discretionary. The number of steps is preferably large.

According to the structure of the conductive part 11, the electric field intensity of the n⁻-type drift region 1 in a position that is arranged in X-direction with the top portion of the conductive part 11 can be increased compared to the semiconductor device 100. As a result, the breakdown voltage of the semiconductor device 140 can be improved. Alternatively, the length of the n⁻-type drift region 1 in Z-direction and the length of the conductive part 11 in Z-direction can be shortened according to increase in the electric field intensity in the n⁻-type drift region 1. Thereby, the on-resistance of the semiconductor device 140 can be reduced while decrease in the breakdown voltage is suppressed.

Figure 8:
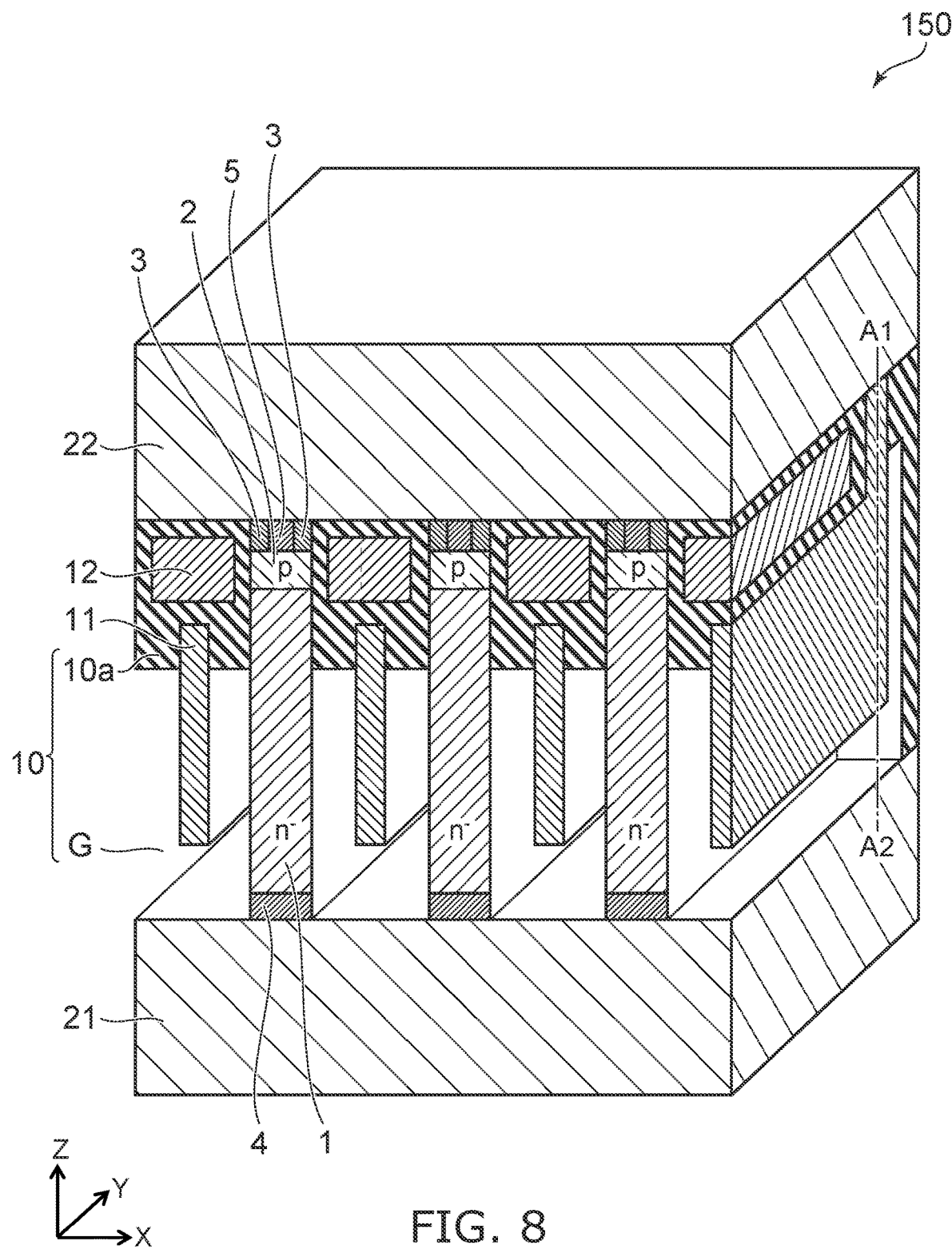
FIG. 8 is a perspective cross-sectional view illustrating semiconductor devices according to a modification.

As a semiconductor device 150 illustrated in FIG. 8, the insulating part 10 may include an insulating portion 10a and a gap G. The gap G is provided between the drain electrode 21 and the conductive part 11, between the n⁺-type drain region 4 and the conductive part 11, and between the n⁻-type drift region 1 and the conductive part 11. The insulating portion 10a is provided above the gap G and the conductive part 11. The lower surface of the insulating portion 10a is positioned lower than the upper surface of the conductive part 11.

Inclusion of the gap G in the insulating part 10 allows the relative permittivity in the insulating part 10 to be reduced. Thereby, the depletion layer easily extends in the n⁻-type drift region 1, and thus the breakdown voltage of the semiconductor device 150 is improved. Alternatively, the thickness of the insulating part 10 between the n⁻-type drift region 1 and the conductive part 11 can be reduced while the breakdown voltage is maintained. For example, the size of the semiconductor device 150 can be reduced. Alternatively, the numbers of the insulating part 10 and n⁻-type drift region 1 per unit area are increased by a thickness corresponding to the reduction in thickness of the insulating part 10. Thus, the on-resistance of the semiconductor device 150 can be reduced while increase in size of the semiconductor device 150 is suppressed.

As an example, in the semiconductor device 150, in a case where a breakdown voltage of 100 V is obtained between the drain electrode 21 and the source electrode 22, the length of the insulating part 10 in X-direction is longer than 0.3 μm and less than 1.0 μm.

FIGS. 9A to 11B are cross-sectional views illustrating a production process of the semiconductor device illustrated in FIG. 8.

In FIGS. 9A to 11B, the left side represents a production process in a part of the X-Z cross-section illustrated in FIG. 8. The right side represents a production process in a part of the X-Z cross-section including the A1-A2 line illustrated in FIG. 8.

Figure 9A:
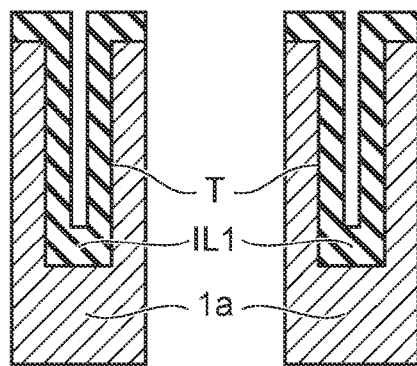
FIGS. 9A to 9D are cross-sectional views illustrating a production process of the semiconductor device illustrated in FIG. 8.

First, an n⁻-type semiconductor substrate 1a is prepared. A plurality of trenches T extending in Y-direction are formed on the upper surface of the semiconductor substrate 1a. For example, as illustrated in FIG. 9A, an insulating layer IL1 is formed along the inner wall of the trench T and the upper surface of the semiconductor substrate 1a by CVD.

Figure 9B:
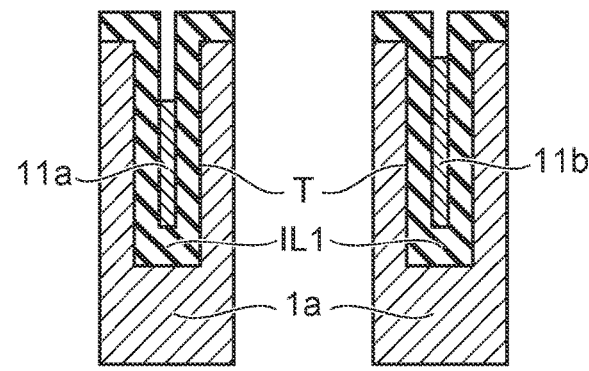

A conductive layer is formed on the insulating layer IL1 by chemical vapor deposition (CVD). The upper surface of this conductive layer is allowed to be recessed by isotropic chemical dry etching (CDE), anisotropic reactive ion etching (RIE), or isotropic wet etching, thus forming a conductive part provided in the trench T. The upper surface of the conductive part is selectively recessed by patterning using lithography. In this way, as illustrated in FIG. 9B, a first conductive portion 11a and a second conductive portion 11b having different lengths in Z-direction are formed. In the subsequent process, the second conductive portion 11b is provided in a portion electrically connected to the source electrode 22. The first conductive portion 11a is provided in other portions.

Figure 9C:
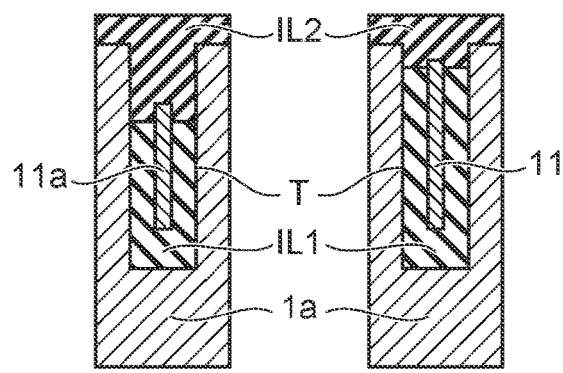

The upper surface of the insulating layer IL1 is allowed to be recessed by CDE or wet etching to a position at which the upper end of the insulating layer IL1 is positioned lower than the upper surface of the first conductive portion 11a and the second conductive portion 11b. As illustrated in FIG. 9C, an insulating layer IL2 for embedding the trench T is formed on the insulating layer IL1, the first conductive portion 11a, and the second conductive portion 11b by CVD. At that time, an insulating material used for formation of the insulating layer IL2 is selected so that the insulating layer IL1 can be selectively etched in the subsequent process. As an example, in a case where the insulating layer IL1 includes silicon nitride, silicon oxide can be used for the insulating layer IL2.

Figure 9D:
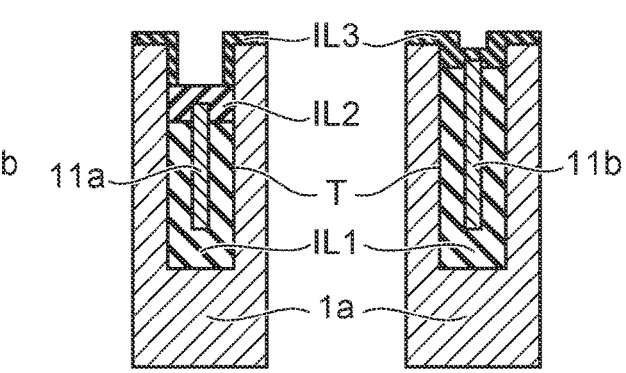

A part of the insulating layer IL2 is removed by CDE or wet etching to expose the upper surface of the semiconductor substrate 1a and a part of the inner wall of the trench T. At that time, the insulating layer IL1 is not substantially removed. On the upper part of the second conductive portion 11b, the insulating layer IL2 is entirely removed. As illustrated in FIG. 9D, an insulating layer IL3 is formed. A part of the insulating layer IL3 finally remains as a gate insulating layer. The insulating layer IL3 is preferably formed by thermal oxidation. The insulating layer IL3 may be formed by depositing silicon oxide by CVD and preforming annealing at high temperature. On the upper part of the first conductive portion 11a, the insulating layer IL3 is formed along the upper surface of the semiconductor substrate 1a and the inner wall of the trench T. On the upper part of the second conductive portion 11b, the upper end of the trench T is embedded with the insulating layer IL3.

Figure 10A:
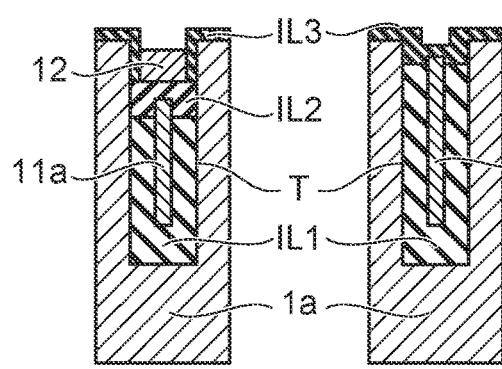
FIGS. 10A to 10D are cross-sectional views illustrating a production process of the semiconductor device illustrated in FIG. 8.
Figure 10B:
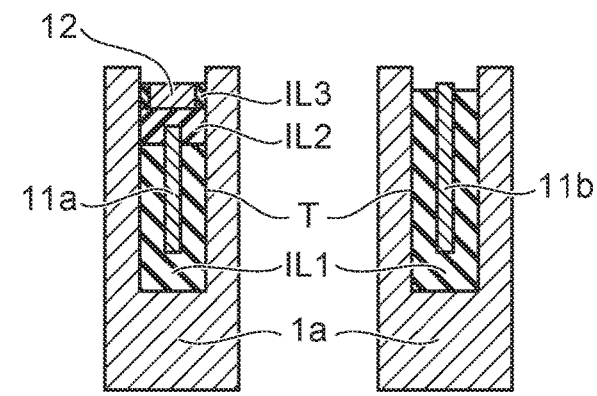

A conductive layer is formed on the insulating layers IL2 and IL3 by CVD. The upper surface of this conductive layer is allowed to be recessed, and thus the gate electrode 12 is formed on the first conductive portion 11a by CDE or wet etching as illustrated in FIG. 10A. A part of the insulating layer IL3 is removed by CDE or wet etching to expose the upper surface of the insulating layer IL1 provided around the second conductive portion 11b as illustrated in FIG. 10B. A part of the insulating layer IL3 remains between the semiconductor substrate 1a and the gate electrode 12.

Figure 10C:
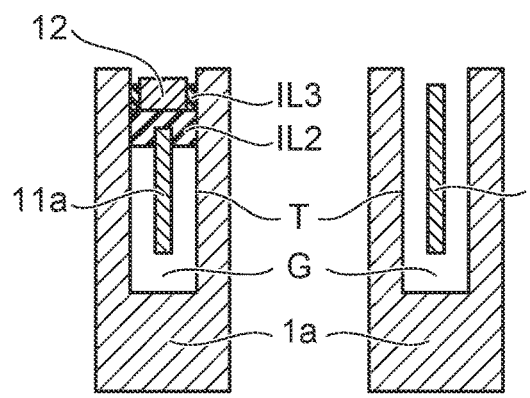

A chemical solution is introduced into an inside of the trench T while the insulating layer IL1 around the second conductive portion 11b is removed by wet etching. Thereby, the insulating layer IL1 around the first conductive portion 11a is also removed, and thus a gap between the semiconductor substrate 1a and the first conductive portion 11a, and between the semiconductor substrate 1a and the second conductive portion 11b is formed as illustrated in FIG. 10C. In a case where the insulating layer IL1 includes silicon nitride and the insulating layer IL2 includes silicon oxide, the insulating layer IL1 can be removed selectively with respect to the insulating layer IL2 by wet etching using phosphoric acid.

Figure 10D:
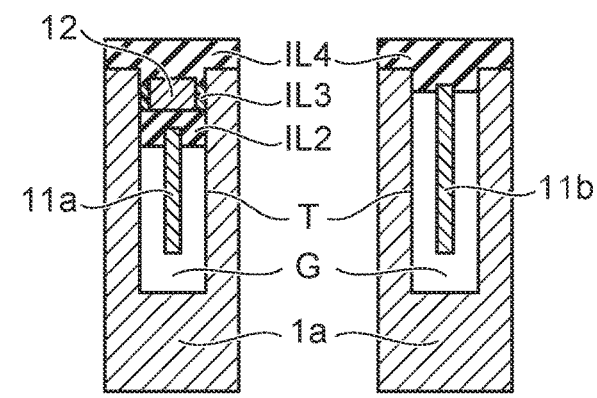

An insulating layer IL4 is formed on the upper surface of the semiconductor substrate 1a by CVD. As illustrated in FIG. 10D, the gap is closed by the insulating layer IL4. At that time, in the subsequent process, to suppress warpage of the substrate and damage of the insulating layer IL4 due to thermal expansion of gas in this gap, the insulating layer IL4 may be formed in a reduced-pressure atmosphere. In this case, the air pressure of the gap is less than the atmospheric pressure.

Figure 11A:
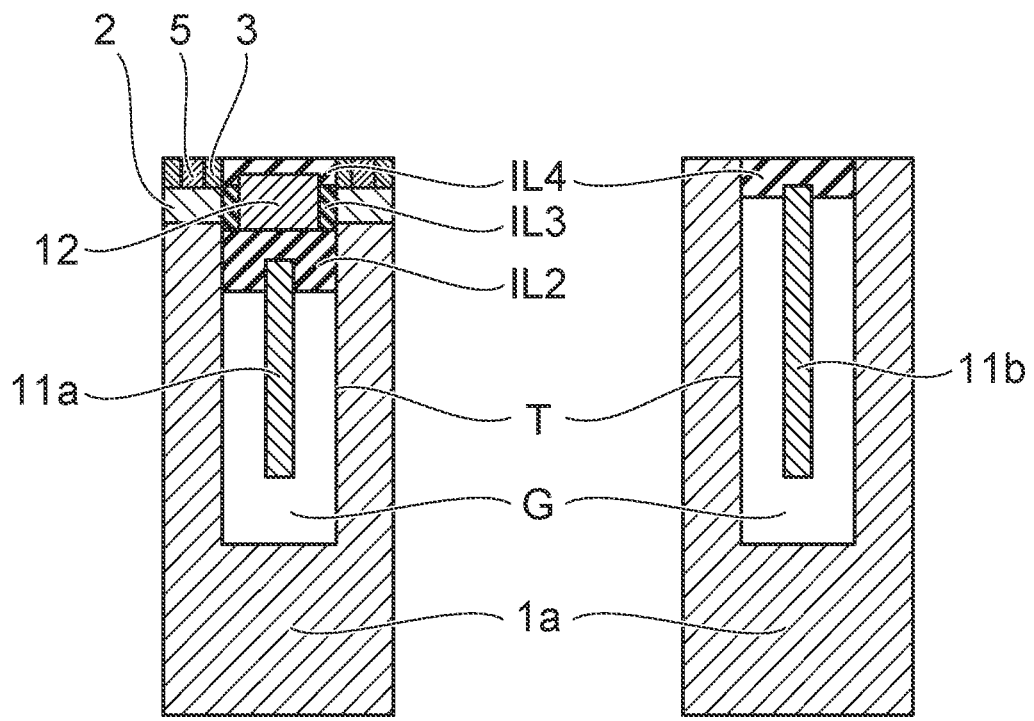
FIGS. 11A and 11B are cross-sectional views illustrating a production process of the semiconductor device illustrated in FIG. 8.

The upper surface of the insulating layer IL4 is allowed to be recessed by CMP to expose the upper surface of the semiconductor substrate 1a. The p-type impurity and the n-type impurity are sequentially ion-implanted into the upper surface of the exposed semiconductor substrate 1a to form the p-type base region 2, the $n^+$-type source region 3, and the $p^+$-type contact region 5 as illustrated in FIG. 11A.

Figure 11B:
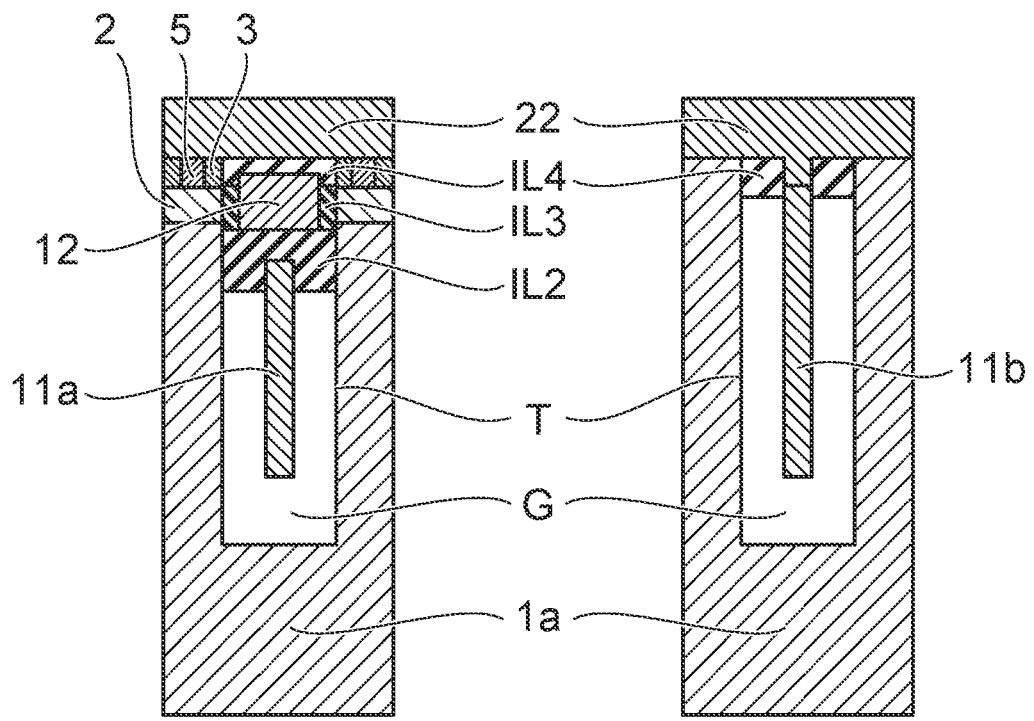

A part of the insulating layer IL4 is removed by RIE to expose the upper end of the second conductive portion 11b. As illustrated in FIG. 11B, the source electrode 22 is formed on the $n^+$-type source region 3, the $p^+$-type contact region 5, and the insulating layer IL4 by sputtering. The second conductive portion 11b is electrically connected to the source electrode 22. Thereafter, the semiconductor device 150 is produced by carrying out the processes illustrated in FIGS. 2A to 3B.

Figure 12:
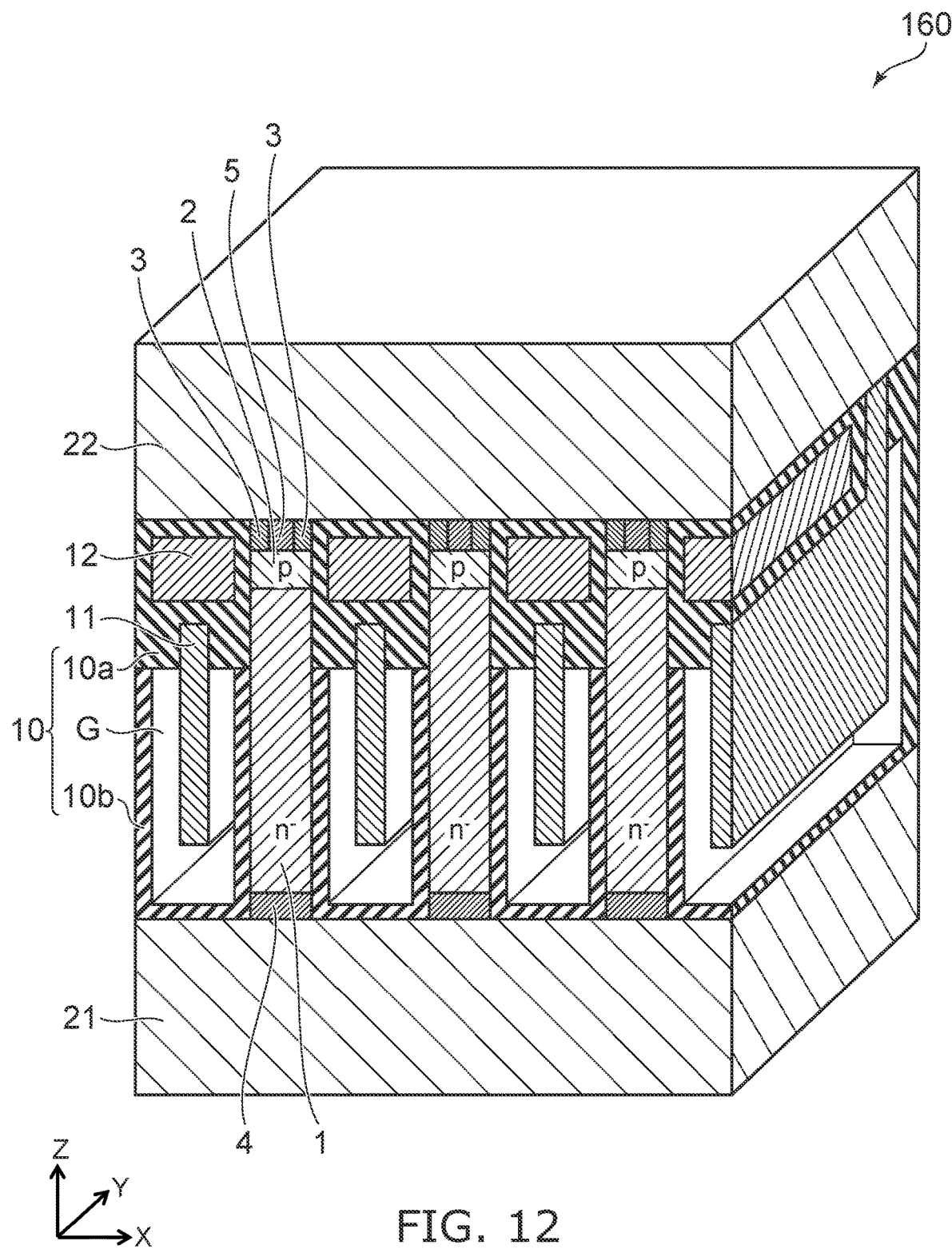
FIG. 12 is a perspective cross-sectional view illustrating a semiconductor device according to a modification.
Figure 13:
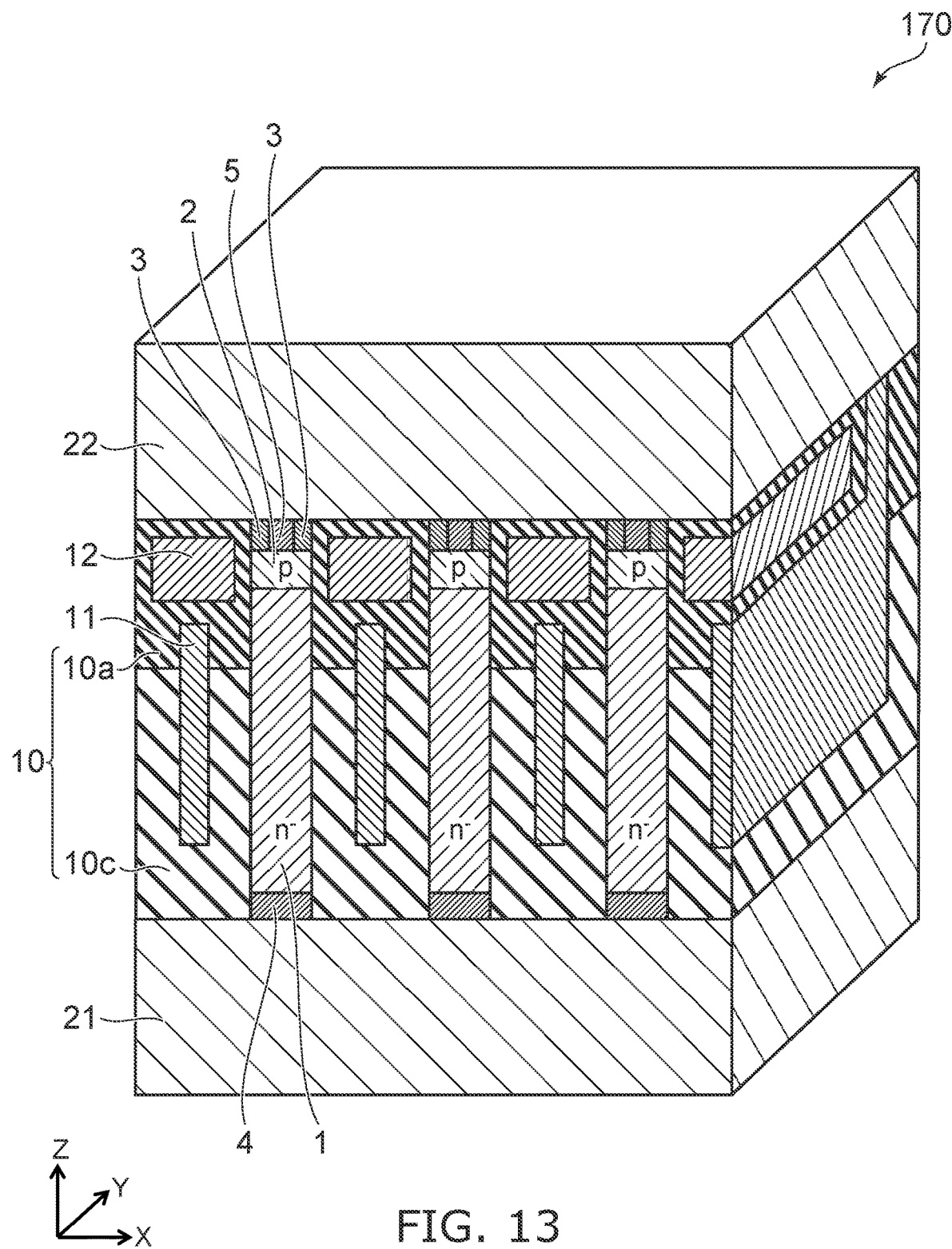
FIG. 13 is a perspective cross-sectional view illustrating a semiconductor device according to a modification.
Figure 14:
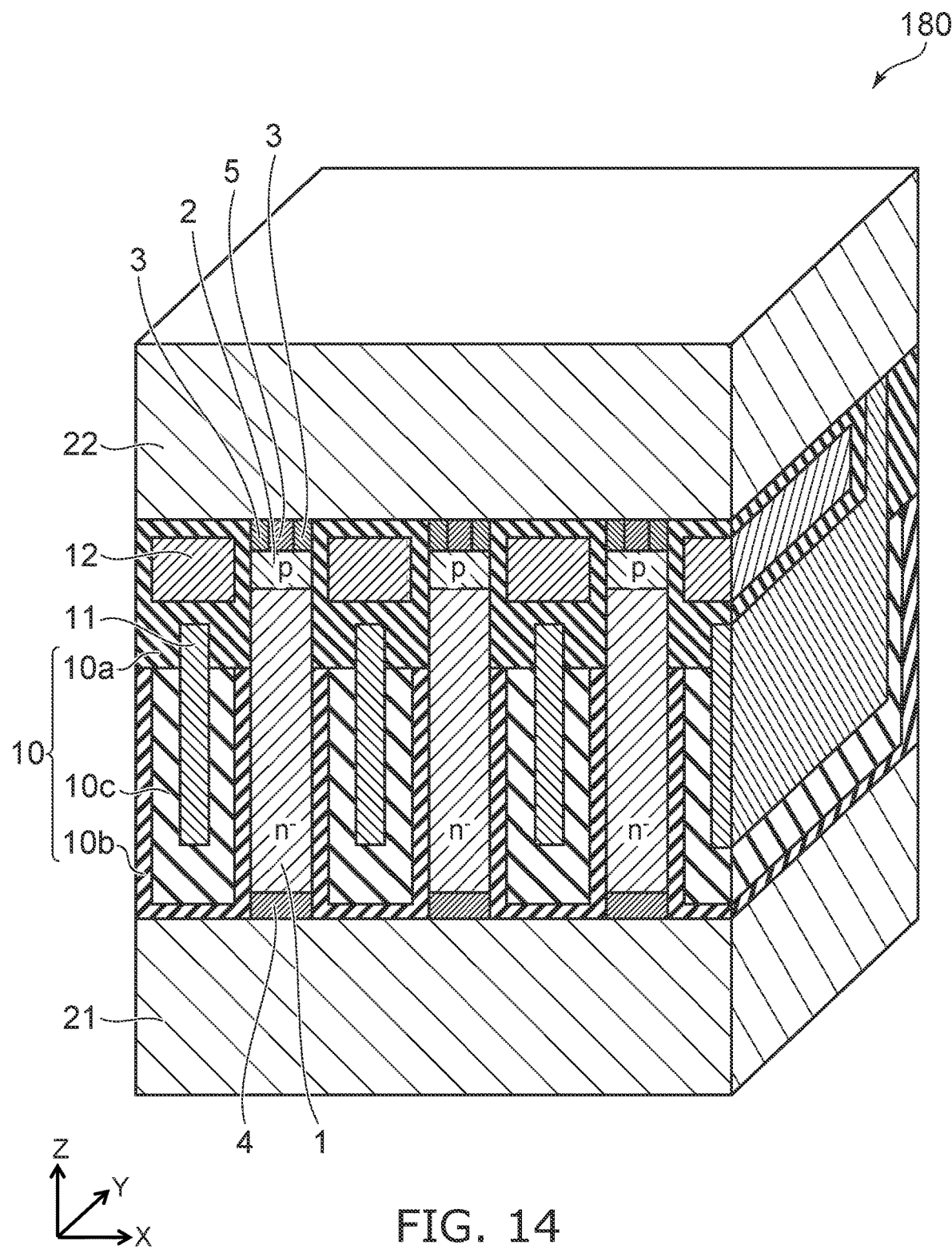
FIG. 14 is a perspective cross-sectional view illustrating a semiconductor device according to a modification.

FIGS. 12 to 14 are perspective cross-sectional views illustrating semiconductor devices according to modifications.

In a semiconductor device 160 illustrated in FIG. 12, the insulating part 10 includes an insulating portion 10a, an insulating portion 10b, and a gap G.

The insulating portion 10b is provided along the drain electrode 21, the $n^+$-type drain region 4, and the $n^-$-type drift region 1. The gap G is provided between the insulating portion 10b and the conductive part 11. The insulating portion 10a is provided above the insulating portion 10b, the gap G, and the conductive part 11. The gate electrode 12 is provided in the upper portion of the insulating portion 10a. The lower surface of the insulating portion 10a exposed to the gap G is positioned lower than the upper surface of the conductive part 11.

The insulating portion 10b is formed by, for example, subjecting the semiconductor substrate 1a to thermal oxidation after the process illustrated in FIG. 10C. By providing the insulating portion 10b, it is possible to prevent the surface of the $n^+$-type drain region 4 and the $n^-$-type drift region 1 from being exposed to the gap G. For example, by covering the surface of the $n^-$-type drift region 1 with the insulating portion 10b, it is possible to prevent leak current from flowing into the surface of the $n^-$-type drift region 1.

In a semiconductor device 170 illustrated in FIG. 13, the insulating part 10 includes insulating portions 10a and 10c. The insulating portion 10c is provided between the drain electrode 21 and the conductive part 11, between the $n^+$-type drain region 4 and the conductive part 11, and between the $n^-$-type drift region 1 and the conductive part 11. The insulating portion 10a is provided on the insulating portion 10c and the conductive part 11.

The relative permittivity in the insulating portion 10c is lower than the relative permittivity in the insulating portion 10a. For example, the insulating portion 10a includes silicon oxide. The insulating portion 10c includes insulating materials having lower relative permittivity than the relative permittivity of silicon oxide, such as silicon oxide to which fluorine or carbon is added, and poly-arylene (PAr). The insulating portion 10c may be porous in order to reduce the relative permittivity.

For example, in the process illustrated in FIG. 9A, the insulating layer IL1 is formed with the above-described material having low relative permittivity. After formation of the conductive part 11 and the gate electrode 12, the p-type base region 2, the $n^+$-type source region 3, the $p^+$-type contact region 5, the source electrode 22, and the like are formed without removing the insulating layer IL1. The remaining insulating layer IL1 corresponds to the insulating portion 10c.

According to the semiconductor device 170, the relative permittivity of the insulating part 10 can be reduced compared to the semiconductor device 100. Thereby, the depletion layer easily extends in the $n^-$-type drift region 1 and the breakdown voltage of the semiconductor device 170 is improved. Alternatively, the thickness of the insulating part 10 between the $n^-$-type drift region 1 and the conductive part 11 can be reduced while the breakdown voltage is maintained. For example, the size of the semiconductor device 170 can be reduced. Alternatively, the numbers of the insulating part 10 and $n^-$-type drift region 1 per unit area are increased by a thickness corresponding to the reduction in thickness of the insulating part 10. Thus, the on-resistance of the semiconductor device 170 can be reduced while increase in size of the semiconductor device 170 is suppressed. Also, according to the semiconductor device 170, the mechanical strength of the insulating part 10 is improved compared to the semiconductor devices 150 and 160. This can reduce a possibility that the semiconductor device 170 is damaged.

As a semiconductor device 180 illustrated in FIG. 14, the insulating part 10 may include the insulating portions 10a to 10c. The insulating portion 10b is provided along the drain electrode 21, the $n^+$-type drain region 4, and the $n^-$-type drift region 1. The insulating portion 10c is provided between the insulating portion 10b and the conductive part 11. The insulating portion 10a is provided on the insulating portion 10b, the insulating portion 10c, and the conductive part 11.

According to the above modifications, the on-resistance of each semiconductor device can be reduced as in the embodiments. Further, the structure according to each modification can be combined as appropriate. For example, in the semiconductor devices 110 to 130, the width of the conductive part 11 may vary in Z-direction as in the semiconductor device 140. In the semiconductor devices 110 to 140, the insulating part 10 may include the gap G as in the semiconductor device 150 or 160. In the semiconductor devices 110 to 140, the insulating part 10 may include the insulating portion 10c.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a first electrode;
a first semiconductor region of a first conductivity type provided on the first electrode and electrically connected to the first electrode;
a second semiconductor region of a second conductive type provided on the first semiconductor region;
a third semiconductor region of the first conductive type provided on the second semiconductor region;
an insulating part provided on the first electrode and being in direct contact with the first electrode;
a conductive part provided in the insulating part and arranged in a second direction that crosses a first direction directed from the first electrode to the first semiconductor region, with the first semiconductor region;
a second electrode provided on the third semiconductor region and the insulating part, and electrically connected to the third semiconductor region; and
a gate electrode provided in the insulating part, the gate electrode being positioned between the conductive part and the second electrode.

2. The device according to claim 1, wherein a part of the insulating part is arranged in the second direction with a part of the first electrode.

3. The device according to claim 1, wherein
the first electrode includes
a first metal layer including a first metal that is at least one selected from the group consisting of aluminum, nickel, copper, silver, vanadium, and chromium, and
a first conductive layer provided between the first metal layer and the first semiconductor region and including a second metal that is at least one selected from the group consisting of molybdenum, tungsten, cobalt, nickel, tungsten, and aluminum; and
the first metal is different from the second metal, or a composition of the first metal is different from a composition of the second metal.

4. The device according to claim 3, wherein at least a part of the first conductive layer is arranged in the second direction with a part of the insulating part.

5. The device according to claim 1, wherein a length of a lower portion of the conductive part in the second direction is shorter than a length of an upper portion of the conductive part in the second direction.

6. The device according to claim 1, wherein the conductive part is electrically connected to the second electrode.

7. The device according to claim 1, wherein
the second electrode includes
a second metal layer including a third metal that is at least one selected from the group consisting of aluminum, nickel, copper, silver, vanadium, and chromium, and
a second conductive layer provided between the third semiconductor region and the second metal layer and including a fourth metal that is at least one selected from the group consisting of molybdenum, tungsten, cobalt, nickel, titanium, and aluminum; and
the third metal is different from the fourth metal, or a composition of the third metal is different from a composition of the fourth metal.

8. The device according to claim 1, further comprising a fourth semiconductor region of a first conductivity type provided between the first electrode and the first semiconductor region, wherein a density of first conductivity type impurity in the fourth semiconductor region is higher than a density of first conductivity type impurity in the first semiconductor region.

9. The device according to claim 1, wherein the insulating part includes a gap provided between the first electrode and the conductive part and between the first semiconductor region and the conductive part.

* * * * *